US010433456B2

(12) United States Patent
Holma et al.

(10) Patent No.: US 10,433,456 B2
(45) Date of Patent: Oct. 1, 2019

(54) MODULAR ELECTRICAL SYSTEM

(71) Applicant: CORIANT OY, Espoo (FI)

(72) Inventors: Antti Holma, Espoo (FI); Petri Kohonen, Vantaa (FI); Pasi Raikkonen, Roykka (FI)

(73) Assignee: Coriant Oy, Espoo, FL (US)

( * ) Notice: Subject to any disclaimer, the term of this patent is extended or adjusted under 35 U.S.C. 154(b) by 0 days.

(21) Appl. No.: 15/557,840

(22) PCT Filed: Mar. 24, 2015

(86) PCT No.: PCT/FI2015/050199
§ 371 (c)(1),
(2) Date: Sep. 13, 2017

(87) PCT Pub. No.: WO2016/151179
PCT Pub. Date: Sep. 29, 2016

(65) Prior Publication Data
US 2018/0295743 A1 Oct. 11, 2018

(51) Int. Cl.
*H05K 7/20* (2006.01)
*H05K 7/18* (2006.01)
*H04Q 1/02* (2006.01)

(52) U.S. Cl.
CPC ......... *H05K 7/20154* (2013.01); *H05K 7/186* (2013.01); *H05K 7/20563* (2013.01); *H04Q 1/035* (2013.01); *H04Q 1/155* (2013.01)

(58) Field of Classification Search
CPC ............... H05K 7/20154; H05K 7/186; H05K 7/20563; F28F 2250/00–108; F28F 2215/00; H01L 23/367–3677
See application file for complete search history.

(56) References Cited

U.S. PATENT DOCUMENTS

| 6,219,229 B1 * | 4/2001 | Lee | G06F 1/18 |
| | | | 361/679.08 |
| 6,449,150 B1 * | 9/2002 | Boone | H05K 7/20563 |
| | | | 165/104.33 |

(Continued)

OTHER PUBLICATIONS

International Search Report, dated Nov. 27, 2015, from corresponding PCT/FI2015/050199 application.

*Primary Examiner* — David M Sinclair
*Assistant Examiner* — Robert D Brown
(74) *Attorney, Agent, or Firm* — Young & Thompson

(57) ABSTRACT

An electrical system includes modules and a frame structure for mechanically supporting the modules successively in an arrival direction of cooling air. Each module includes a cooling element in heat conductive relation with one or more electrical components. The frame structure mechanically supports the modules so that the cooling elements are substantially in the same attitude and successively in the arrival direction of the cooling air. The cooling elements are shaped so that, when the modules are mechanically supported by the frame structure, the cooling elements conduct cooling air in a direction deviating from the arrival direction of the cooling air. Furthermore, at least a part of a flank of the heat transfer portion of each cooling element is oblique with respect to the arrival direction of the cooling air. Thus, each of the cooling elements receives a fresh portion of the cooling air.

20 Claims, 3 Drawing Sheets

(56) References Cited

U.S. PATENT DOCUMENTS

| | | | | |
|---|---|---|---|---|
| 6,580,616 B2* | 6/2003 | Greenside | H05K 7/1409 | 361/752 |
| 6,608,755 B2* | 8/2003 | Baldwin | H05K 7/142 | 361/729 |
| 7,254,025 B2* | 8/2007 | Baldwin, Jr. | H05K 7/20672 | 361/688 |
| 7,796,384 B2* | 9/2010 | Irving | H05K 7/20545 | 361/694 |
| 2002/0135990 A1* | 9/2002 | Hattori | H05K 7/1461 | 361/801 |
| 2004/0264145 A1* | 12/2004 | Miller | H05K 7/1489 | 361/725 |
| 2005/0034845 A1* | 2/2005 | Barsun | F28F 3/02 | 165/104.33 |
| 2005/0047084 A1* | 3/2005 | Kabat | H05K 7/20563 | 361/690 |
| 2005/0068722 A1* | 3/2005 | Wei | H05K 7/20563 | 361/679.48 |
| 2005/0099771 A1* | 5/2005 | Wei | H05K 7/20563 | 361/694 |
| 2006/0171119 A1* | 8/2006 | Baldwin, Jr. | H05K 7/20672 | 361/700 |
| 2007/0230118 A1* | 10/2007 | Leija | H05K 7/20718 | 361/690 |
| 2008/0094799 A1* | 4/2008 | Zieman | G06F 1/20 | 361/695 |
| 2009/0231813 A1* | 9/2009 | Busch | H01L 23/467 | 361/702 |
| 2012/0201003 A1* | 8/2012 | Shimasaki | H05K 7/20736 | 361/695 |
| 2015/0090435 A1* | 4/2015 | Xia | F28F 3/00 | 165/185 |
| 2015/0256386 A1* | 9/2015 | Palmer | F24F 11/30 | 709/220 |
| 2017/0108900 A1* | 4/2017 | Chou | G06F 1/20 | |

\* cited by examiner

A - A

MODULAR ELECTRICAL SYSTEM

FIELD OF THE DISCLOSURE

The disclosure relates generally to cooling of an electrical system. More particularly, the disclosure relates to cooling of an electrical system that comprises modules and a frame structure for mechanically supporting the modules.

BACKGROUND

Many electrical systems are modular so that an electrical system comprises modules providing the functionality of the electrical system and a frame structure for mechanically supporting the modules and for connecting the modules communicatively to each other. An electrical system of the kind described above can be, for example but not necessarily, telecommunication equipment where the modules can be for example plug-in units of the telecommunication equipment and the frame structure can be a rack of the telecommunication equipment. Each of the above-mentioned modules comprises typically a circuit board, one or more electrical components on the circuit board, and one or more cooling elements in heat conductive relation with one or more of the electrical components. Each cooling element comprises typically cooling fins and/or tubular cooling channels. A cooling element is needed when heat generation of an electrical component is so high with respect to the mechanical dimensions of the electrical component that the ability of the outer surface of the electrical component to transfer heat to the ambient air is not sufficient. A cooling element is typically used with a high performance integrated circuit that can be for example a processor.

The mechanical arrangement of a modular electrical system of the kind described above can be such that cooling air meets first a cooling element that is cooling one or more electrical components of a first module and subsequently the same cooling air meets another cooling element that is cooling one or more electrical components of a second module. As evident, the cooling of the electrical components of the second module is not as effective as the cooling of the electrical components of the first module because the cooling air is warmed when cooling the electrical components of the first module and the electrical components of the second module are cooled by the warmed cooling air. A situation of the kind described above takes place for example in telecommunication equipment where the cooling air flows vertically and two or more plug-in units are mounted successively in the vertical direction so that the circuit boards of these plug-in units are co-planar, i.e. the circuit boards are in the same geometric plane.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electrical system that can be, for example but not necessarily, telecommunication equipment. An electrical system according to the invention comprises:

modules each comprising a circuit board, one or more electrical components on the circuit board, and a cooling element in heat conductive relation with one or more of the electrical components, and a frame structure for mechanically supporting the modules successively in a first direction so that the circuit boards of the modules are substantially coplanar and the cooling elements of the modules are substantially in a same attitude and mutually successive in the first direction, Each of the cooling elements comprises a heat transfer portion for transferring heat to cooling air. The heat transfer portions of the cooling elements can be provided with cooling fins and/or with tubular cooling channels so as to provide heat-transfer surfaces for transferring heat to the cooling air.

The heat transfer portions are shaped so that, when the modules are mechanically supported by the frame structure so that the modules are successively in a first direction, the circuit boards of the modules are substantially coplanar, and the cooling elements of the modules are successively in the first direction, the heat transfer portions are arranged to conduct the cooling air in a second direction deviating from above-mentioned the first direction. Furthermore, at least a part of a flank of each heat transfer portion is oblique with respect to the first direction so that an acute angle between the at least part of the flank and the second direction is smaller than an acute angle between the first and second directions.

As the above-mentioned second direction deviates from the first direction in which the cooling elements are successively, a significant portion of cooling air warmed by one of the cooling elements is directed to by-pass another one of cooling elements which is after the first mentioned cooling element when seen in the arrival direction of the cooling air. Furthermore, the obliqueness of the at least part of the flank of each heat transfer portion with respect to the first direction facilitates conducting to each cooling element fresh cooling air, i.e. cooling air that has not been warmed by other cooling elements.

The above-mentioned modules can be, for example but not necessarily, plug-in units of telecommunication equipment and the frame structure can be a rack of the telecommunication equipment.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF FIGURES

Exemplifying and non-limiting embodiments of the invention and their advantages are explained in greater detail below in the sense of examples and with reference to the accompanying drawings, in which.

DESCRIPTION OF EXEMPLIFYING AND NON-LIMITING EMBODIMENTS

The specific examples provided in the description given below should not be construed as limiting the scope and/or the applicability of the appended claims. Lists and groups of examples provided in the description given below are not exhaustive unless otherwise explicitly stated.

Figure 1A:
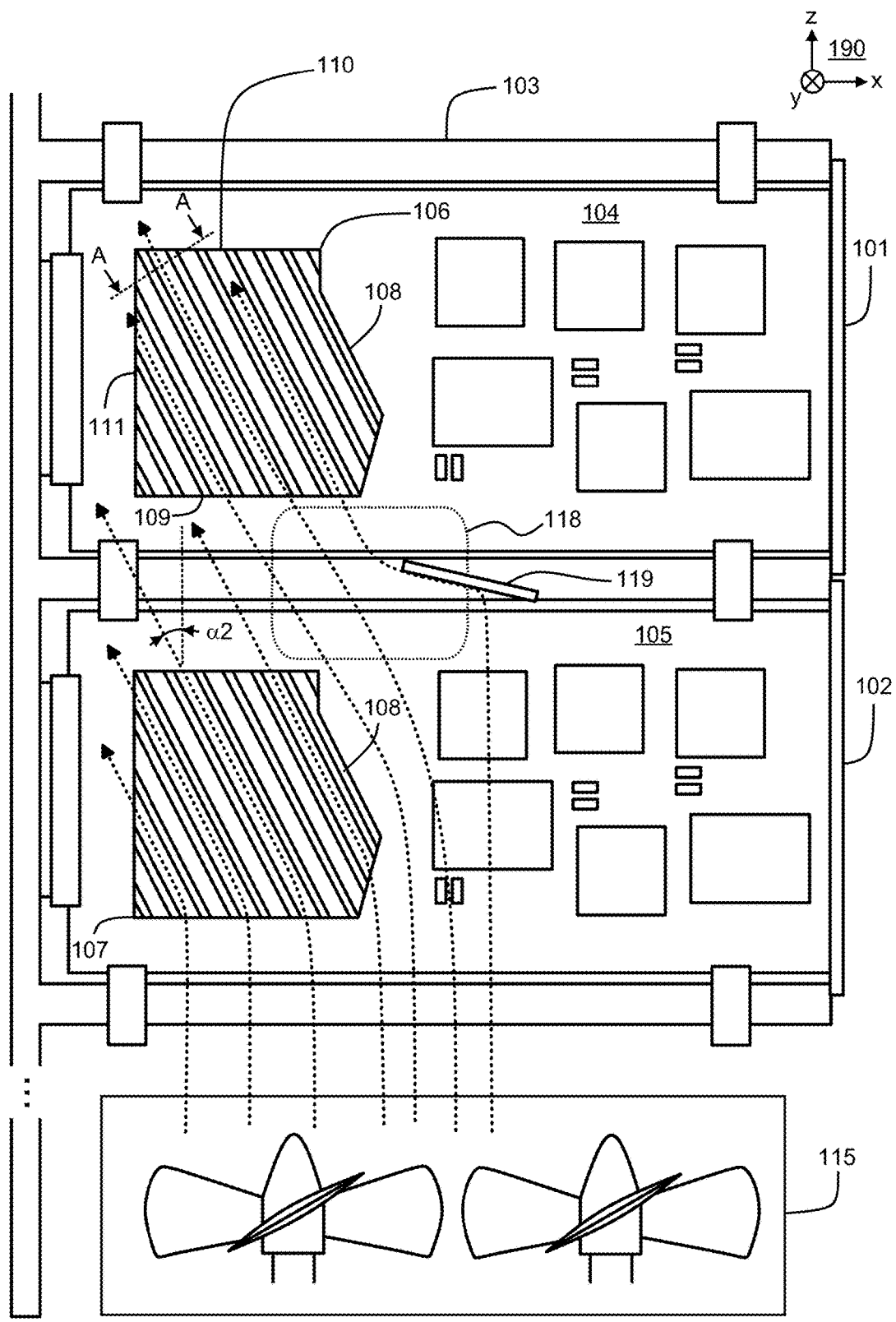
FIGS. 1a and 1b illustrate an electrical system according to an exemplifying and non-limiting embodiment of the invention.

FIG. 1a illustrates an electrical system according to an exemplifying and non-limiting embodiment of the invention. The electrical system comprises a module 101 that comprises a circuit board 104, electrical components on the circuit board, and a cooling element 106 in heat conductive relation with one or more of the electrical components. The one or more electrical components that are in the heat conductive relations with the cooling element 106 are not shown in FIG. 1a because these electrical components are covered by the cooling element 106. The electrical system comprises a module 102 that comprises a circuit board 105, electrical components on the circuit board, and a cooling element 107 in heat conductive relation with one or more of the electrical components. The electrical system comprises a frame structure 103 for mechanically supporting the modules 101 and 102 successively in a first direction so that the circuit boards 104 and 105 of the modules are substantially coplanar and the cooling elements 106 and 107 of the modules are substantially in a same attitude and mutually successive in the first direction. In the exemplifying case shown in FIG. 1a, the above-mentioned first direction is the z-direction of a coordinate system 190. In this exemplifying case, the electrical system comprises a blower 115 for moving cooling air in the first direction to or from the modules 105 and 104. It is, however, also possible that there is no blower and the cooling air flow is caused by the chimney effect. The electrical system can be, for example but not necessarily, telecommunication equipment where the modules 101 and 102 are plug-in units of the telecommunication equipment and the frame structure 103 is a rack of the telecommunication equipment. One or both of the modules 102 and 102 may comprise for example a processing system for supporting at least one of the following data transfer protocols: Internet Protocol "IP", Ethernet protocol, MultiProtocol Label Switching "MPLS" protocol, Asynchronous Transfer Mode "ATM".

Figure 1B:
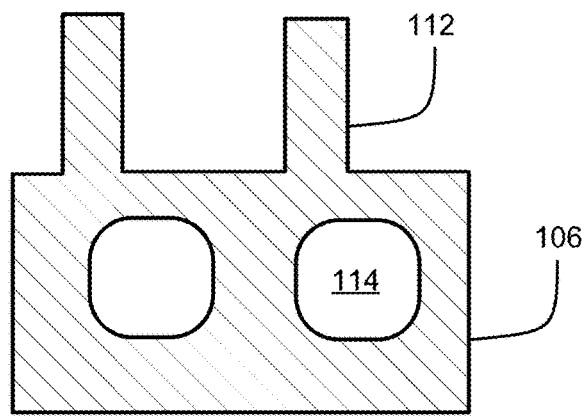

Each of the cooling elements 106 and 107 comprises a heat transfer portion for transferring heat to the cooling air. In the exemplifying case illustrated in FIG. 1a, the heat transfer portions of the cooling elements106 and 107 comprise both cooling fins and tubular cooling channels. FIG. 1b shows a section view of the cooling element 106 where the section is taken along a line A-A shown in FIG. 1a. In FIG. 1b, one of the cooling fins is denoted with a reference number 112 and one of the tubular cooling channels is denoted with a reference number 114. It is also possible that there are only cooling fins or only tubular cooling channels.

The heat transfer portions of the cooling elements 106 and 107 are shaped to conduct the cooling air in a second direction that deviates from the first direction, i.e. from the z-direction. This is implemented so that the cooling fins and the tubular cooling channels of the cooling elements 106 and 107 are oblique with respect to the first direction, i.e. the z-direction. In FIG. 1a, the acute angle between the first and second directions is denoted with $\alpha 2$. The angle $\alpha 2$ can be for example from 5 degrees to 45 degrees, or from 10 degrees to 35 degrees, or from 10 degrees to 45 degrees, or from 20 degrees to 45 degrees, or from 30 degrees to 45 degrees. As the second direction deviates from the first direction in which the cooling elements 106 and 107 are successively, a significant portion of the cooling air warmed by the cooling element 107 is directed to by-pass the cooling element 106. In FIG. 1a, the flow of the cooling air is depicted with dashed-line arrows. The fact that the cooling element 107 directs the cooling air to flow obliquely causes a slight under-pressure on a region 118. This suction effect contributes the flow of fresh cooling air, i.e. cooling air that has not been warmed by the cooling element 107, to the cooling element 106 as illustrated with the dashed-line arrows shown in FIG. 1a. Furthermore, the frame structure 103, the module 101, and/or the module 102 can be provided with one or more air guide elements for further contributing the flow of fresh cooling air to the cooling element 106. In the exemplifying case illustrated in FIG. 1a, the frame structure 103 is provided with an air guide element 119.

A part of a first flank 108 of each of the heat transfer portions of the cooling elements 106 and 107 is oblique with respect to the first direction, i.e. the z-direction, so that the acute angle between the oblique part of the first flank 108 and the second direction is smaller than the acute angle $\alpha 2$ between the first and second directions. As can be understood from FIG. 1a, the obliqueness of the part of the flank 108 facilitates conducting fresh cooling air to the cooling element 106, i.e. cooling air that has not been warmed by the cooling element 107. In the exemplifying case illustrated in FIG. 1a, the oblique part of the flank 108 is substantially parallel with the second direction. Therefore, in this case, the acute angle between the oblique part of the flank 108 and the second direction is substantially zero.

Figure 2:
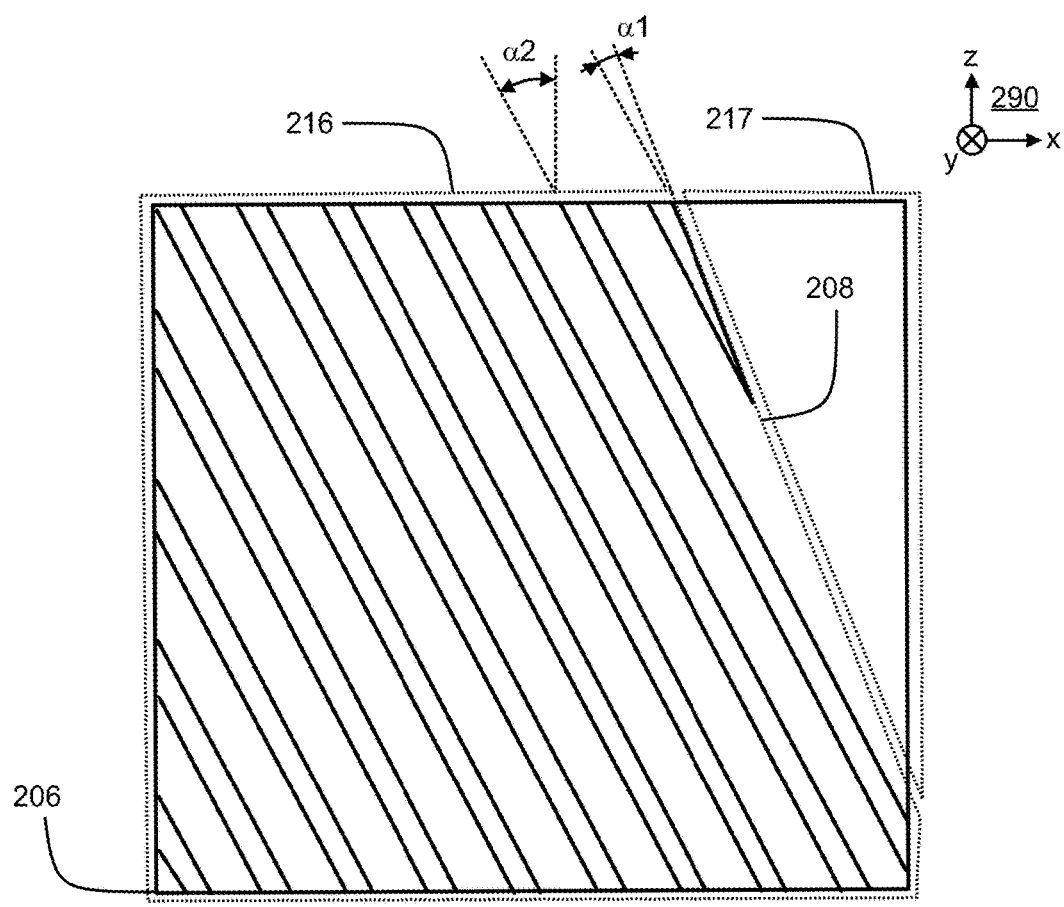
FIG. 2 illustrates a detail of an electrical system according to an exemplifying and non-limiting embodiment of the invention.

In the exemplifying electrical system illustrated in FIG. 1a, the whole front area of each of the cooling elements 106 and 107 is provided with the cooling fins and thus the heat transfer portion of each of the cooling elements 106 and 107 comprises the whole front area of the cooling element under consideration. The term "front area" means the surface of each of the cooling elements 106 and 107 that is shown in FIG. 1a. FIG. 2 illustrates a cooling element 206 of an electrical system according to another exemplifying and non-limiting embodiment of the invention. In the cooling element 206, the heat transfer portion 216 does not comprise the whole front area of the cooling element 206 because a part 217 of the cooling element 206 lacks cooling fins. The part 217 can be needed for example for providing a heat conductive relation with one or more electrical components. The part 217 is arranged to lack cooling fins in order to achieve the same effect that is achieved with the oblique part of the flank 108 in the electrical system shown in FIG. 1a. In the exemplifying case illustrated in FIG. 2, the above-mentioned acute angle between the flank 208 of the heat transfer portion 216 and the second direction is non-zero. This acute angle is denoted with al in FIG. 2. The angle al can be for example from −25 degrees to 25 degrees, or from −20 degrees to 20 degrees, or from −15 degrees to 15 degrees, or from −10 degrees to 10 degrees, or from −5 degrees to 5 degrees. The acute angle between the first and second directions is denoted with $\alpha 2$ in the same way as in FIG. 1a. The first direction is assumed to be parallel with the z-direction of a coordinate system 290.

Figure 3:
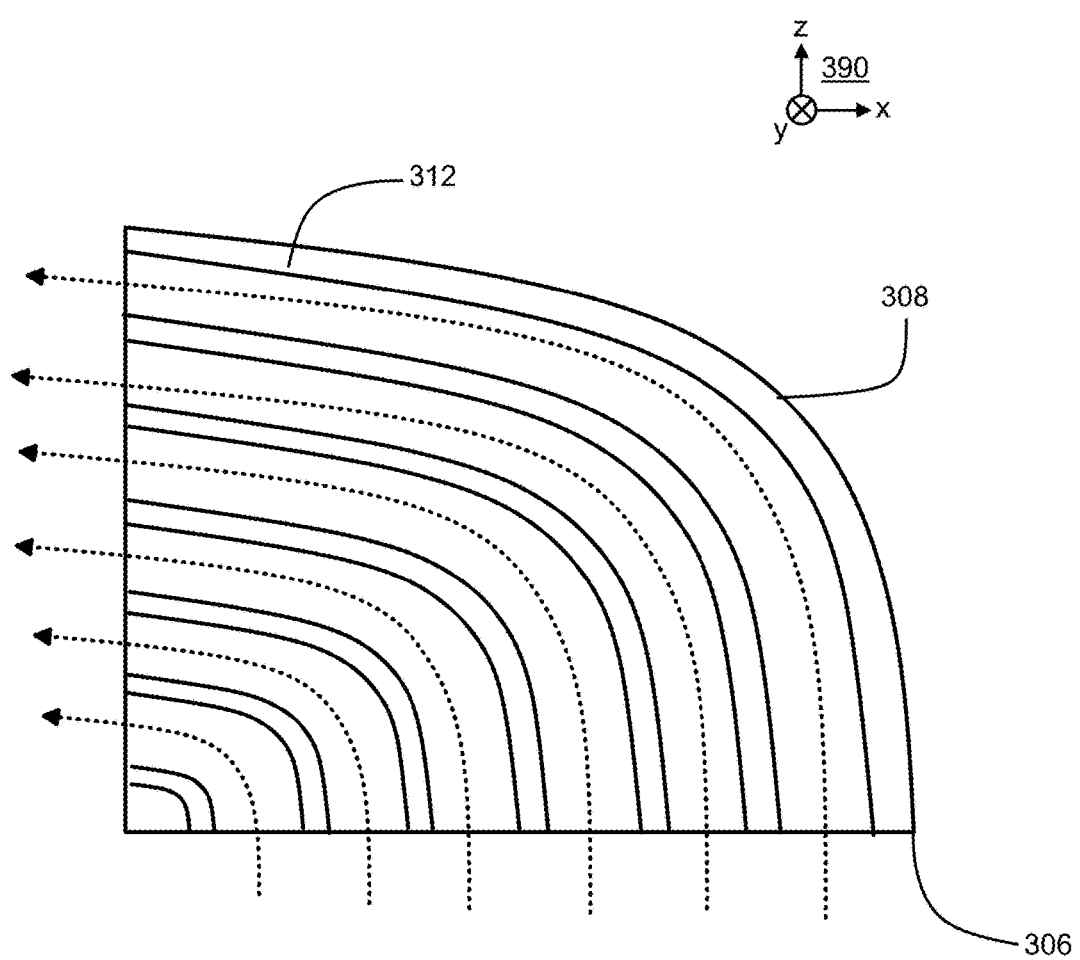
FIG. 3 illustrates a detail of an electrical system according to an exemplifying and non-limiting embodiment of the invention.

In the exemplifying cases illustrated in FIGS. 1a, 1b and 2, the cooling fins are linear but this is not the only possible choice. FIG. 3 illustrates a cooling element 306 of an electrical system according to an exemplifying and non-limiting embodiment of the invention. In this exemplifying case, the cooling fins are curvilinear. In FIG. 3, one of the cooling fins is denoted with a reference number 312. A curvilinear flank 308 of the cooling element 306 is oblique with respect to the z-direction of a coordinate system 390 in order to achieve the same effect that is achieved with the oblique part of the flank 108 in the electrical system shown in FIG. 1a.

In the exemplifying electrical system illustrated in FIG. 1a, a first end of each cooling element is wider than a second end of the cooling element under consideration, the first and second ends are substantially perpendicular to the first direction, i.e. the z-direction, and a second flank of each cooling element is substantially parallel with the first direction. In FIG. 1a, the first end of the cooling element 106 is denoted with a reference number 109, the second end of the cooling element 106 is denoted with a reference number 110, and the second flank of the cooling element 106 denoted with a reference number 111.

The specific examples provided in the description given above should not be construed as limiting the applicability and/or the interpretation of the appended claims. Lists and groups of examples provided in the description given above are not exhaustive unless otherwise explicitly stated.

What is claimed is:

1. An electrical system comprising:
   modules each comprising a circuit board, one or more electrical components on the circuit board, and a cooling element in heat conductive relation with one or more of the electrical components, and
   a frame structure for mechanically supporting the modules successively in a first direction so that the circuit boards of the modules are substantially coplanar and the cooling elements of the modules are substantially in a same attitude and mutually successive in the first direction,
   wherein each of the cooling elements comprises a heat transfer portion for transferring heat to cooling air, and the heat transfer portions are shaped so that, when the modules are mechanically supported by the frame structure so that the modules are successively in a first direction, the circuit boards of the modules are substantially coplanar, and the cooling elements of the modules are successively in the first direction, the heat transfer portions are arranged to conduct the cooling air in a second direction deviating from the first direction, and at least a part of a first flank of each of the heat transfer portions is oblique with respect to the first direction so that an acute angle between the at least part of the first flank and the second direction is smaller than an acute angle between the first and second directions.

2. An electrical system according to claim 1, wherein the at least part of the first flank that is oblique with respect to the first direction is substantially parallel with the second direction, the acute angle between the at least part of the first flank and the second direction being substantially zero.

3. An electrical system according to claim 1, wherein a first end of each of the heat transfer portions is wider than a second end of the respective one of the cooling elements.

4. An electrical system according to claim 1, wherein first and second ends of each of the heat transfer portions are substantially perpendicular to the first direction.

5. An electrical system according to claim 1, wherein a second flank of each of the heat transfer portions is substantially parallel with the first direction.

6. An electrical system according to claim 1, wherein the heat transfer portion of each of the cooling elements comprises cooling fins for guiding the cooling air to flow in the second direction and for transferring heat to the cooling air.

7. An electrical system according to claim 1, wherein the heat transfer portion of each of the cooling elements comprises tubular cooling channels for guiding the cooling air to flow in the second direction and for transferring heat to the cooling air.

8. An electrical system according to claim 1, wherein the acute angle between the first and second directions is from 5 degrees to 45 degrees.

9. An electrical system according to claim 8, wherein the acute angle between the first and second directions is from 10 degrees to 35 degrees.

10. An electrical system according to claim 1, wherein the electrical system comprises a blower for moving the cooling air in the first direction.

11. An electrical system according to claim 1, wherein the electrical system is telecommunication equipment, the modules are plug-in units of the telecommunication equipment, and the frame structure is a rack of the telecommunication equipment.

12. An electrical system according to claim 11, wherein at least one of the modules comprises a processing system for supporting at least one of the following data transfer protocols: Internet Protocol "IP", Ethernet protocol, MultiProtocol Label Switching "MPLS" protocol, Asynchronous Transfer Mode "ATM".

13. An electrical system according to claim 2, wherein a first end of each of the heat transfer portions is wider than a second end of the respective one of the cooling elements.

14. An electrical system according to claim 2, wherein first and second ends of each of the heat transfer portions are substantially perpendicular to the first direction.

15. An electrical system according to claim 3, wherein first and second ends of each of the heat transfer portions are substantially perpendicular to the first direction.

16. An electrical system according to claim 2 wherein a second flank of each of the heat transfer portions is substantially parallel with the first direction.

17. An electrical system according to claim 3, wherein a second flank of each of the heat transfer portions is substantially parallel with the first direction.

18. An electrical system according to claim 4, wherein a second flank of each of the heat transfer portions is substantially parallel with the first direction.

19. An electrical system according to claim 2, wherein the heat transfer portion of each of the cooling elements comprises cooling fins for guiding the cooling air to flow in the second direction and for transferring heat to the cooling air.

20. An electrical system according to claim 3, wherein the heat transfer portion of each of the cooling elements comprises cooling fins for guiding the cooling air to flow in the second direction and for transferring heat to the cooling air.

* * * * *